United States Patent [19]

Sakura

[11] Patent Number: 5,138,148
[45] Date of Patent: Aug. 11, 1992

[54] FIBER OPTIC RECEIVING CIRCUIT HAVING IMPROVED GAIN OVER A WIDE FREQUENCY BAND

[75] Inventor: Shigeyuki Sakura, Kawasaki, Japan

[73] Assignee: Kabushiki Kaisha Toshiba, Kawasaki, Japan

[21] Appl. No.: 618,466

[22] Filed: Nov. 27, 1990

[30] Foreign Application Priority Data

Nov. 30, 1989 [JP] Japan .................................. 1-311334

[51] Int. Cl.$^5$ .............................................. H01J 40/14
[52] U.S. Cl. .................... 250/214 A; 359/189
[58] Field of Search .................... 250/214 A, 214 R; 455/619; 330/291, 293, 294; 307/311; 359/189, 194

[56]         References Cited
       U.S. PATENT DOCUMENTS

| 4,314,152 | 2/1982 | Fenk .................. 250/214 A |
| 4,591,725 | 5/1986 | Bryant ................ 250/214 A |
| 4,731,529 | 3/1988 | Ohsawa ............... 250/214 A |

FOREIGN PATENT DOCUMENTS

| 0014350  | 8/1980  | European Pat. Off. . |
| 2180905  | 11/1973 | France . |
| 60-134611| 7/1985  | Japan . |
| 2164515A | 3/1986  | United Kingdom . |

OTHER PUBLICATIONS

Patent Abstract of Japan, vol. 7, No. 267 (E-213) (1412) Nov. 29, 1983.
Radio Fernsehen Elektronik, vol. 33, No. 12, Dec. 1984, Berlin 33, p. 813.
Abstract of Japanese Patent (Kokai) No. 60-134611, 1985, printed from JAPIO data base of ORBIT computer service on Mar. 27, 1991.

Primary Examiner—David C. Nelms
Assistant Examiner—Michael Messinger
Attorney, Agent, or Firm—Finnegan, Henderson, Farabow, Garrett and Dunner

[57]             ABSTRACT

The present invention aims to provide a fiber optic receiving circuit which can obtain a sufficient frequency band even if a junction capacity of a photo diode is large, wherein a voltage dividing ratio of said voltage dividing circuit, a capacity value of a capacitor, a junction capacity value of a photo diode, and an open loop gain of an amplifier are determined so that current, which flows in the capacitor, cancels current, which flows in a junction capacity of the photo diode and causes frequency deterioration, and the junction capacity of the photo diode, which causes the frequency deterioration, does not relate to an output voltage of the amplifier, thereby obtaining a flat gain characteristic over the broad range of the frequency band regardless of the junction capacity of the photo diode.

10 Claims, 2 Drawing Sheets

FIBER OPTIC RECEIVING CIRCUIT HAVING IMPROVED GAIN OVER A WIDE FREQUENCY BAND

BACKGROUND OF THE INVENTION

1. Field of the Invention

The present invention relates generally to a fiber optic receiving circuit and, more particularly to a fiber optic receiving module for converting an optical signal to an electrical signal by means of an optical fiber.

2. Description of the Related Art

A conventional fiber optic receiving circuit includes an amplifier of parallel feedback type as shown in FIG. 1. This is disclosed in Published Unexamined Japanese Patent Application No. 60-134611. Such a fiber optic receiving circuit includes an input terminal 2, an amplifier 1 having a negative-phase output terminal 3, a photo diode 4 connected between the input terminal 2 and a power source Vcc, and a feedback resistor 5 connected between the input terminal 2 and the negative-phase output terminal 3.

The operation of the above circuit can be logically expressed as follows:

$$v_o = -Av_i \quad (1)$$

wherein an input voltage of amplifier 1 is $v_i$, an output voltage is $v_o$, and an open loop gain is $-A$.

$$\frac{v_o - v_i}{R_F} + i - j\omega C_J v_i = 0 \quad (2)$$

wherein a signal current supplied from the photo diode 4 is i, resistance of the feedback resistor 5 is $R_F$, and a junction capacity of the photo diode 4 is $C_J$.

If $v_i$ is eliminated from equations (1) and (2), $$v_o = \frac{-R_F \cdot i}{1 + \frac{1}{A}} \cdot \frac{1}{1 + j\omega \frac{R_F C_J}{1 + A}} \quad (3)$$

normally $A >> 1$, and if the following are provided, $$1 + \frac{1}{A} \doteq 1 \quad (4)$$

$$1 + A \doteq A \quad (5)$$

$$|v_o| = \frac{R_F i}{\sqrt{1 + \frac{\omega^2 R_F^2 C_J^2}{A^2}}} \quad (6)$$

Therefore, a cut-off frequency $f_c$ in the area of $-3$ dB down can be obtained as follows:

$$f_c = \frac{1}{2\pi \frac{R_F C_J}{A}} \quad (7)$$

Also, the conversion gain at the frequency which is sufficiently lower than $f_c$ becomes $R_F$. Therefore, to obtain sufficient gain over a broad range of frequency band, it is required that $R_F$ and A are set to be extremely large and $C_J$ is set to be extremely small.

However, there is a case that junction capacity $C_J$ of the photo diode 4 cannot be made small. For example, in a case where a light receiving area must be enlarged in connection with the optical fiber to be used, or the photo diode 4 must be formed of not PIN structure but PN structure, a problem exists in that a sufficient frequency band cannot be obtained with the gain to be used.

SUMMARY OF THE INVENTION

Accordingly, an object of the present invention is to provide a fiber optic receiving circuit in which a sufficient frequency band can be obtained even if junction capacity $C_J$ of the photo diode is large.

According to the present invention, there is provided a fiber optic receiving circuit, which comprises an amplifier having an input terminal, a positive-phase output terminal, and a negative-phase output terminal, a photo diode connected to the input terminal, a feedback resistor connected between the input terminal and the negative-phase output terminal, a voltage dividing circuit dividing the voltage of the positive-phase output terminal, and a capacitor connected between a voltage dividing point of the voltage dividing circuit and the input terminal, wherein a voltage dividing ratio of the voltage dividing circuit, the capacity value of the capacitor, the junction capacity value of the photo diode, an open loop gain of the amplifier are determined so that current flowing in the capacitor cancels the current which flows in the junction capacity of the photo diode and causes the frequency deterioration.

According to another aspect of the present invention, there is provided a fiber optic receiving circuit, which comprises an amplifier having an input terminal, a positive-phase output terminal, and a negative-phase output terminal, a feedback resistor connected between the input terminal and the negative-phase output terminal, a voltage dividing circuit dividing the voltage of the positive-phase output terminal, a photo diode connected between the voltage dividing point of the voltage dividing circuit and the input terminal, wherein a voltage dividing ratio of the voltage dividing circuit, and an open loop gain of the amplifier are determined so as to prevent the current causing the frequency deterioration from flowing in the junction capacity of the photo diode.

According to the preferred embodiments of the present invention, the circuit structure of is made so that the junction capacity $C_J$ of the photo diode causing the frequency deterioration is not related to the output voltage of the amplifier, thereby obtaining a flat gain characteristic over a broad range of frequency band regardless of junction capacity $C_J$.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The embodiments of the present invention will be explained with reference to the drawings.

Figure 2:
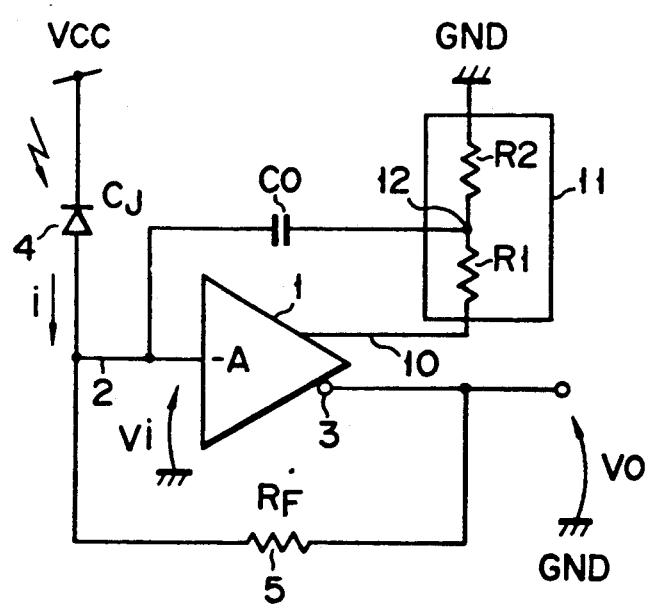
FIG. 2 is a circuit diagram showing the structure of a first embodiment of the present invention.
Figure 3:
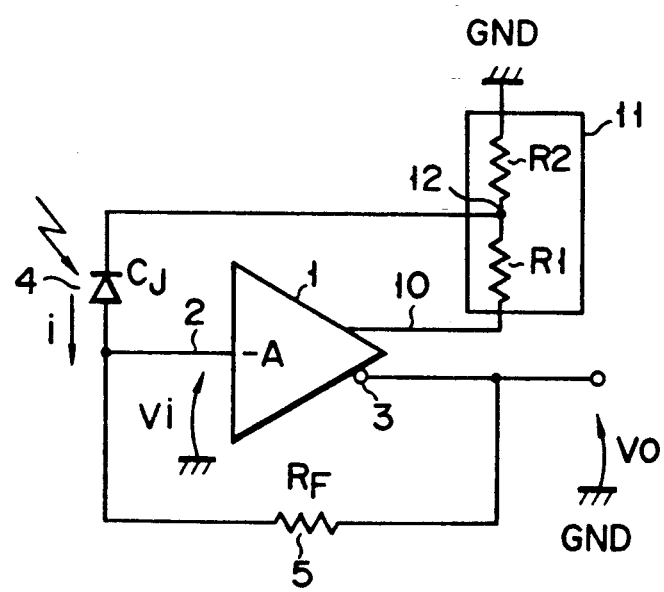
FIG. 3 is a circuit diagram showing the structure of a second embodiment of the present invention.

FIG. 2 shows the first embodiment of the fiber optic receiving circuit of the present invention. Components of FIG. 2 corresponding to components of FIG. 3 are labeled with corresponding reference numbers. The features of the preferred embodiments of the present invention can be explained as follows:

A voltage dividing circuit 11 comprising resistors $R_1$ and $R_2$ is connected between a positive-phase output terminal 10 of an amplifier 1 and a ground voltage GND. A capacitor $C_O$ is connected between a voltage dividing point 12 and an input terminal 2.

Figure 1:
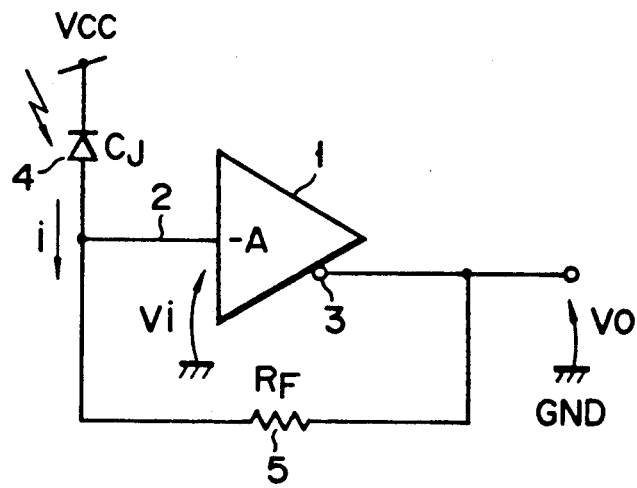
FIG. 1 is a circuit diagram showing the structure of a conventional fiber optic receiving circuit.

The operation of the fiber optic receiving circuit as structured in FIG. 1 can be logically expressed as follows:

$$v_o = -A v_i \tag{8}$$

wherein an input voltage of amplifier 1 is $v_i$, an output voltage is $v_o$, and an open loop gain is $-A$.

$$\frac{v_o - v_i}{R_F} + i - j\omega C_J v_i + j\omega C_O \left( \frac{-R_2 v_o}{R_1 + R_2} - v_i \right) = 0 \tag{9}$$

wherein a signal current supplied from a photo diode 4 is i, a resistance of a feedback resistor 5 is $R_F$, and a junction capacitor of the photo diode 4 is $C_J$.

If $v_i$ the eliminated from equations (8) and (9), the following equation can be obtained:

$$v_o = \frac{-i}{\frac{1 + \frac{1}{A}}{R_F} + j\omega \left( \frac{C_J + C_O}{A} - \frac{C_O R_2}{R_1 + R_2} \right)} \tag{10}$$

Then, determine each value of the following equation (11):

$$\frac{C_J + C_O}{A} = \frac{C_O R_2}{R_1 + R_2} \tag{11}$$

In other words, a term having $j\omega$ (angular frequency) of equation (10) becomes zero, and a flat gain ranging from the frequency of 0 Hz up to a wide frequency band can be obtained. In other words, the above point can be expressed as follows:

$$v_o = \frac{-i R_F}{1 + \frac{1}{A}} \tag{12}$$

Thereby, band deterioration due to the junction capacity $C_J$ of the receiving element 4 can be controlled, and the photo diode having a flat gain characteristic over the wide frequency band can be obtained. This is because in equation (9) current $(-j\omega C_J v_i)$ flowing in the junction capacity $C_J$ and causing the frequency deterioration, is canceled by current $$\left( j\omega C_O \left[ \frac{-R_2 v_o}{R_1 + R_2} - v_i \right] \right)$$

flowing in the capacitor $C_O$.

In the above equation (11) left side=right side, but there is a possibility that left side < right side, depending on the difference in the characteristic of each element in the actual manufacturing process. If such a case occurs, the amount of the positive feedback, which is determined by the voltage dividing ratio of the voltage dividing circuit 11 of FIG. 2 and capacitor $C_O$ and supplied from the negative output terminal 3, become larger than the amount of the negative feedback, which is passed through the feedback resistor 5 and supplied from the negative output terminal 3. As a result, the circuit of FIG. 2 oscillates. Therefore, the left side should be slightly larger than the right side. In this case, since the circuit of FIG. 2 has simply high cut-off frequency having no influence upon the operation, it can be regarded that no deterioration occurs by the frequency characteristic. Thereby, the generation of oscillation can be surely prevented.

FIG. 3 shows the second embodiment of the fiber optic receiving circuit of the present invention. In this embodiment, junction capacity $C_J$ of photo diode 4 is used in place of the capacitor $C_O$ of FIG. 2 connected to the input terminal 2 from the dividing point 12, and the dividing point 12 of the voltage dividing circuit 11 is connected to the cathode of the photo diode 4.

In the circuit of FIG. 3, by the similar method to the case of FIG. 2, it can be expressed as follows:

$$v_o = \frac{-i}{\frac{1 + \frac{1}{A}}{R_F} + j\omega C_J \left( \frac{1}{A} - \frac{R_2}{R_1 + R_2} \right)} \tag{13}$$

$$\text{Then, } \frac{1}{A} = \frac{R_2}{R_1 + R_2}. \tag{14}$$

Thereby, the frequency deterioration occurred by junction capacity $C_J$ can be controlled. In the above case, $C_O$ and $C_J$ are equal to each other in equation (11). In FIG. 2, the current other than signal current i, which flows in the photo diode 4 and causes the frequency deterioration, is canceled by the current flowing in the capacitor $C_O$. In FIG. 3, the current, which causes the frequency deterioration, is not supplied to the junction capacity $C_J$. Therefore, it can be considered that the current, which causes the frequency deterioration, is equivalently canceled.

In the above equation (14), the left side is logically equal to the right side, but there is a possibility that left side < right side, depending on the difference in the characteristic of each element in the actual manufacturing process, similar to the circuit of FIG. 2. If such a case occurs, the amount of the positive feedback, which is determined by the voltage dividing ratio of the voltage dividing circuit 11 of FIG. 3 and capacitor $C_J$ of and supplied from the positive output terminal 10, become larger than the amount of the negative feedback, which is passed through the feedback resistor 5 and supplied from the negative output terminal 3. As a result, the circuit of FIG. 3 oscillates. Therefore, the left side should be slightly larger than the right side to surely prevent the oscillation of the circuit.

According to the structure of the circuit of each embodiment, there can be provided a fiber optic receiving circuit wherein a flat gain characteristic can be obtained over the broad range of frequency band without receiving the frequency band limitation due to the junction capacity of the photo diode.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. A fiber optic receiving circuit, comprising:
   an amplifier having an input terminal, a positive-phase output terminal, and a negative-phase output terminal;
   a photoelectric detector connected to said input terminal;
   a feedback resistor connected between said input terminal and said negative-phase output terminal;
   a voltage dividing circuit for dividing the voltage of said positive-phase output terminal; and
   a capacitor connected between a voltage dividing point of said voltage dividing circuit and said input terminal, wherein a voltage dividing ratio of said voltage dividing circuit, a capacity value of said capacitor, a junction capacity value of said photoelectric detector, and an open loop gain of said amplifier are determined so that a current flowing in said capacitor cancels a current flowing in the junction capacity that tends to cause frequency deterioration.

2. A fiber optic receiving circuit according to claim 1, wherein a first value obtained by dividing the sum of the value of the junction capacity of said photoelectric detector and the capacity value of said capacitor by the absolute value of said open loop gain, and a second value obtained by multiplying a voltage dividing ratio of said voltage dividing circuit by the capacitor value of said capacitor, are substantially equal to each other.

3. A fiber optic receiving circuit according to claim 1, wherein a value obtained by multiplying a voltage dividing ratio of said voltage dividing circuit by the capacity value of said capacitor is slightly smaller than a value obtained by dividing the sum of the value of the junction capacity of said photoelectric detector and the capacity value of said capacitor by the absolute value of said open loop gain.

4. A fiber optic receiving circuit, comprising:
   an amplifier having an input terminal, a positive-phase output terminal, and a negative-phase output terminal;
   a feedback resistor connected between said input terminal and said negative-phase output terminal;
   a voltage dividing circuit dividing for the voltage of said positive-phase output terminal; and
   a photoelectric detector connected between a voltage dividing point of said voltage dividing circuit and said input terminal, wherein a voltage dividing value of said voltage dividing circuit, and an open loop gain of said amplifier are determined so as to prevent a current causing a frequency deterioration from flowing in a junction capacity of said photoelectric detector.

5. A fiber optic receiving circuit according to claim 4, wherein an inverse number of an absolute value of said open loop gain, and a voltage dividing ratio of said voltage dividing circuit are substantially equal to each other.

6. A fiber optic receiving circuit according to claim 4, wherein a voltage dividing ratio of said voltage dividing circuit is slightly smaller than an inverse number of an absolute value of said open loop gain.

7. An optical receiving circuit adapted to receive a reference voltage, comprising:
   means for conveying an optical signal to an electrical signal, including a junction capacity having a first capacity value;
   means for amplifying the electrical signal, including an input coupled to the converting means, a positive-phase output, and a negative-phase output;
   resistor means coupled between the input and the negative-phase output;
   means for generating a voltage between the reference voltage and a voltage on the positive-phase output, in accordance with a ratio; and
   capacitor means, coupled between the voltage generating means and the input, having a second capacity value, wherein a combination of the ratio, the first capacity value, the second capacity value, and an open loop gain of the amplifier is such that a current flowing in the capacitor means substantially cancels a current flowing in the junction capacity that tends to cause frequency deterioration.

8. An optical receiving circuit according to claim 7, wherein a value obtained by multiplying the ratio by second capacity value is not greater than a value obtained by dividing the sum of the first capacity value and the second capacity value by the absolute value of said open loop gain.

9. An optical receiving circuit adapted to receive a reference voltage, comprising:
   means for amplifying, including an input, a positive-phase output, and a negative-phase output;
   resistor means coupled between the input and the negative-phase output;
   means for generating a voltage between the reference voltage and a voltage on the positive-phase output, in accordance with a ratio; and
   means, coupled between the voltage generating means and the input, for converting an optical signal to an electrical signal, including a junction capacity, wherein a combination of the ratio and an open loop gain of the amplifying means is such that a current causing a frequency deterioration is substantially prevented from flowing in the junction capacity.

10. An optical receiving circuit according to claim 9, wherein the ratio is not greater than the reciprocal of an absolute value of the open loop gain.

* * * * *

UNITED STATES PATENT AND TRADEMARK OFFICE
CERTIFICATE OF CORRECTION

PATENT NO. :  5,138,148
DATED      :  August 11, 1992
INVENTOR(S) : Shigeyuki Sakura It is certified that error appears in the above-identified patent and that said Letters Patent is hereby corrected as shown below:

```
Claim 4, column 5, line 58, change "dividing for"
to --for dividing--.
```

Signed and Sealed this

First Day of February, 1994

Attest:

BRUCE LEHMAN

Attesting Officer        Commissioner of Patents and Trademarks